(12) United States Patent
Carlsen et al.

(10) Patent No.: US 7,861,543 B2
(45) Date of Patent: Jan. 4, 2011

(54) WATER CARRYOVER AVOIDANCE METHOD

(75) Inventors: Peter Ring Carlsen, Aalborg (DK); Ole Mølgaard Christensen, Haderslev (DK)

(73) Assignee: American Power Conversion Corporation, West Kingston, RI (US)

( * ) Notice: Subject to any disclaimer, the term of this patent is extended or adjusted under 35 U.S.C. 154(b) by 1007 days.

(21) Appl. No.: 11/592,611

(22) Filed: Nov. 3, 2006

(65) Prior Publication Data

US 2008/0104987 A1    May 8, 2008

(51) Int. Cl.
   *F25D 21/00*   (2006.01)
   *F25B 49/00*   (2006.01)
(52) U.S. Cl. .......................... 62/150; 62/176.6; 62/272; 236/44 C; 165/231
(58) Field of Classification Search ............. 62/150, 62/176.1, 176.3, 176.6, 259.2, 272; 236/44 A, 236/44 C; 165/230, 231
See application file for complete search history.

(56) References Cited

U.S. PATENT DOCUMENTS

| | | | |
|---|---|---|---|
| 3,559,728 A | 2/1971 | Lyman | |
| 4,197,716 A | 4/1980 | Nussbaum | |
| 4,285,205 A | 8/1981 | Martin et al. | |
| 4,774,631 A | 9/1988 | Okuyama et al. | |
| 4,837,663 A | 6/1989 | Zushi et al. | |
| 4,911,231 A | 3/1990 | Horne et al. | |
| 5,173,819 A | 12/1992 | Takahashi et al. | |
| 5,649,428 A | 7/1997 | Calton et al. | |
| 5,657,641 A | 8/1997 | Cunningham et al. | |
| 5,934,368 A * | 8/1999 | Tanaka et al. ............... | 165/233 |
| 5,982,652 A | 11/1999 | Simonelli et al. | |
| 6,427,454 B1 * | 8/2002 | West .............................. | 62/93 |
| 6,459,579 B1 | 10/2002 | Farmer et al. | |
| 6,494,050 B2 | 12/2002 | Spinazzola et al. | |
| 6,662,576 B1 | 12/2003 | Bai | |
| 6,668,565 B1 | 12/2003 | Johnson et al. | |
| 6,695,577 B1 | 2/2004 | Susek | |
| 6,745,590 B1 | 6/2004 | Johnson et al. | |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |
| 7,033,267 B2 | 4/2006 | Rasmussen | |
| 7,046,514 B2 | 5/2006 | Fink et al. | |
| 7,112,131 B2 | 9/2006 | Rasmussen et al. | |

(Continued)

FOREIGN PATENT DOCUMENTS

EP    1610077 A2    12/2005

OTHER PUBLICATIONS

"Essential Cooling System Requirements for Next Generation Data Centers," White Paper #5, Revision 3, 2003 American Power Conversion, Rev 2002-3, pp. 1-10.

(Continued)

*Primary Examiner*—Marc E Norman
(74) *Attorney, Agent, or Firm*—Lando & Anastasi, LLP (57) ABSTRACT

A method of preventing water carryover to an object cooled by an air flow from a cooling device includes receiving at least one representation of a relative humidity of the air flow, and preventing water carryover to the object by adjusting at least one cooling parameter of the cooling device based, at least in part, on the relative humidity. Further embodiments and cooling systems are also disclosed.

12 Claims, 5 Drawing Sheets

U.S. PATENT DOCUMENTS

| | | |
|---|---|---|
| 7,140,193 B2 | 11/2006 | Johnson et al. |
| 7,145,772 B2 | 12/2006 | Fink |
| 7,148,796 B2 | 12/2006 | Joy et al. |
| 7,155,318 B2 * | 12/2006 | Sharma et al. .............. 700/276 |
| 7,165,412 B1 | 1/2007 | Bean, Jr. |
| 7,173,820 B2 | 2/2007 | Fink et al. |
| 7,293,666 B2 | 11/2007 | Mattlin et al. |
| 2003/0042004 A1 | 3/2003 | Novotny et al. |
| 2003/0158718 A1 | 8/2003 | Nakagawa et al. |
| 2004/0099747 A1 | 5/2004 | Johnson et al. |
| 2005/0170770 A1 | 8/2005 | Johnson et al. |
| 2005/0225936 A1 | 10/2005 | Day |
| 2006/0082263 A1 | 4/2006 | Rimler et al. |
| 2006/0102575 A1 | 5/2006 | Mattlin et al. |
| 2006/0139877 A1 | 6/2006 | Germagian et al. |
| 2006/0162357 A1 | 7/2006 | Fink et al. |
| 2006/0260338 A1 | 11/2006 | VanGilder et al. |
| 2006/0276121 A1 | 12/2006 | Rasmussen |
| 2007/0038414 A1 | 2/2007 | Rasmussen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0085678 A1 | 4/2007 | Joy et al. |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0174024 A1 | 7/2007 | Rasmussen et al. |
| 2008/0041076 A1 | 2/2008 | Tutunoglu et al. |
| 2008/0041077 A1 | 2/2008 | Tutunoglu |

OTHER PUBLICATIONS

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Air Distribution Architecture Options for Mission Critical Facilities," White Paper #55, Revision 1, 2003 American Power Conversion, Rev 2003-0, pp. 1-13.

"How and Why Mission-Critical Cooling Systems Differ From Common Air Conditions," White Paper #56, Revision 2, 2003 American Power Conversion, Rev 2003-2, pp. 1-13.

Tony Evans, "Fundamental Principles of Air Conditioners for Information Technology," White Paper #57, Revision 1, 2004 American Power Conversion, Rev 2004-1, pp. 1-9.

Tony Evans, "Humidification Strategies for Data Centers and Network Rooms," White Paper 58, 2004 American Power Conversion, Rev 2004-0, pps. 1-13.

Tony Evans, "The Different Types of Air Conditioning Equipment for IT Environments," White Paper #59, 2004 American Power Conversion, Rev 2004-0, pp. 1-21.

Neil Rasmussen, "Guidelines for Specification of Data Center Power Density," White Paper #120, 2005 American Power Conversion, Rev 2005-0, pp. 1-21.

International Search Report for PCT/US2006/037772 mailed Jul. 10, 2007.

* cited by examiner

WATER CARRYOVER AVOIDANCE METHOD

BACKGROUND OF INVENTION

1. Field of Invention

Embodiments of the invention relate generally to devices and methods for cooling electronic equipment. Specifically, aspects of the invention relate to methods of preventing water carryover from a cooling device to the electronic equipment.

2. Discussion of Related Art

Heat produced by electronic equipment can have adverse effects on the performance, reliability and useful life of the equipment. Over the years, as electronic equipment becomes faster, smaller, and more power consuming, such equipment also produces more heat, making control of heat critical to reliable operation.

A typical environment where heat control may be critical includes a data center containing racks of electronic equipment, such as servers and CPUs. As demand for processing power has increased, data centers have increased in size so that a typical data center may now contain hundreds of such racks. Furthermore, as the size of electronic equipment has decreased, the amount of electronic equipment in each rack and power consumption of the equipment has increased. An exemplary industry standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

To address the heat generated by electronic equipment, such as the rack-mounted electronic equipment of a modern data center, air cooling devices have been used to provide a flow of cool air to the electronic equipment. In the data center environment, such cooling devices may be referred to as computer room air conditioner ("CRAC") units. These CRAC units intake warm air from the data center and output cooler air into the data center. The temperature of air taken in and output by such CRAC units may vary depending on the cooling needs and arrangement of a data center. In general, such CRAC units intake room temperature air at about 72 to 95° F. and discharge cooler air at below about 60 to 71° F.

The electronic equipment in a typical rack is cooled as the cool air is drawn into the rack and over the equipment. The air is heated by this process and exhausted out of the rack. Data centers may be arranged in various configurations depending on the purposes of the data center. Some configurations include a room-oriented configuration in which cool air is output in general to the data center room. Other configurations include a row-oriented configuration in which CRAC units and equipment racks are arranged to produce hot and cold air aisles. Still other configurations include a rack-oriented configuration in which each rack has a dedicated CRAC unit.

SUMMARY OF INVENTION

At least one aspect of the invention is directed to a method of preventing water carryover to an object cooled by an air flow from a cooling device. In some embodiments, the method comprises receiving at least one representation of a relative humidity of the air flow, and preventing water carryover to the object by adjusting at least one cooling parameter of the cooling device based, at least in part, on the relative humidity.

In some embodiments of the method, the relative humidity may include the relative humidity of the air flow provided to the object from the cooling device. In one embodiment, the method may further comprise cooling the air flow with a heat exchanger of the cooling device and propelling the air flow by a fan of the cooling device. In one embodiment, the at least one cooling parameter includes at least one of a compressor speed and a fan speed. In some embodiments, preventing water carryover includes limiting the at least one cooling parameter to a maximum value based, at least in part, on the relative humidity. In one embodiment, the maximum value includes at least one of a maximum compressor speed of the cooling device and a maximum fan speed of the cooling device. In some embodiments, the method further comprises an act of measuring the relative humidity. In one embodiment, measuring the relative humidity includes using at least one relative humidity sensor positioned in an air flow between the cooling device and the object to measure the relative humidity of the air flow.

In some embodiments, the method further comprises receiving a representation of at least one of an absolute humidity, a temperature, a speed, and a pressure of the air flow through the cooling device. In one embodiment, the at least one pressure of the air flow includes at least one pressure of the air flow through a cooling coil of the cooling device. In some embodiments, preventing water carryover includes an act of adjusting at least one cooling parameter based, at least in part, on the relative humidity and the at least one of the absolute humidity, the temperature, the speed, and the pressure of the air flow through the cooling device. In some embodiments, the method further comprises mapping a plurality of maximum values of the at least one cooling parameter based, at least in part, on a plurality of values of the relative humidity and the at least one of the absolute humidity, the temperature, the speed, and the pressure of the air flow through the cooling device. In one embodiment, preventing water carryover includes an act of limiting the at least one cooling parameter to a mapped maximum value corresponding to a value of the relative humidity and the at least one of the absolute humidity, the temperature, the speed, and the pressure of the air flow through the cooling device. In some embodiments, the method further includes measuring the at least one of the absolute humidity, the temperature, the speed, and the pressure of air flow through the cooling device. In one embodiment, the method includes using at least one sensor positioned in the air flow between the cooling device and the electronic equipment to measure the at least one of the temperature, the absolute humidity, the speed, and the pressure of the air flow through the cooling device.

In some embodiments, the method further comprises mapping a plurality of maximum values of the at least one cooling parameter based, at least in part, on a plurality of values of the relative humidity. In one embodiment, preventing water carryover includes limiting the at least one cooling parameter to a mapped maximum value corresponding to a value of the relative humidity. In one embodiment, the object includes at least on piece of electronic equipment.

Another aspect of the invention is directed to a cooling system. In one embodiments, the cooling system comprises at least one cooling device configured to provide an air flow, and a controller coupled to the at least one cooling device and configured to prevent water carryover from the cooling device by adjusting at least one parameter of the at least one cooling device, based, at least in part, on a relative humidity of the air flow.

In one embodiment, the at least one cooling device includes at least one fan and at least one compressor, and the at least one parameter includes at least one of a compressor speed and a fan speed. In one embodiment, the controller is configured to limit the at least one parameter to at least one maximum value. In some embodiments, the system further comprises at least one sensor configured to measure the relative humidity and transmit at least one representation of the at least one relative humidity to the controller. In one embodiment, the at least one sensor is positioned within the air flow.

In some embodiments, the controller is configured to adjust the at least one parameter based, at least in part, on the relative humidity of the air flow and at least one of an absolute humidity of the air flow, a temperature of the air flow, a speed of the air flow, and a pressure of the air flow. In one embodiment, the cooling device includes at least one cooling coil and the pressure of the air flow includes a pressure of the air flow through the cooling coil. In some embodiments, the controller is further configured to limit the at least one parameter based on at least one stored value indicating a maximum parameter value corresponding to the relative humidity and the at least one of the absolute humidity, the temperature, the speed, and the pressure of the air flow. In one embodiment, the controller includes at least one memory component configured to store the at least one stored value. In some embodiments, the system further comprises at least one sensor configured to measure the at least one of the absolute humidity, the temperature, the speed, and the pressure of the air flow. In one embodiment, the at least one sensor is positioned in the air flow.

In some embodiments, the controller is further configured to limit the at least one parameter based on at least one stored value indicating a maximum parameter value corresponding to the relative humidity. In one embodiment, the controller includes at least one memory component configured to store the at least one stored value. In one embodiment, the system includes at least one computer room air cooling (CRAC) unit.

Yet another aspect of the invention is directed to a method of preventing water carryover in a cooling system. Some embodiments comprise generating at least one stored value indicating at least one maximum cooling parameter value that corresponds to at least one relative humidity value, measuring a current relative humidity of an air flow generated from a cooling device, comparing the current relative humidity to the at least one relative humidity value, determining a current maximum cooling parameter value, and limiting a cooling parameter of the cooling device to the maximum cooling parameter value. Some embodiments include directing the air flow from the cooling device towards at least one piece of electronic equipment. In one embodiment, the cooling parameter includes at least one of a fan speed and a compressor speed of the cooling device.

The invention will be more fully understood after a review of the following figures, detailed description and claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

In general, at least one embodiment of the invention is directed at preventing water carryover from a cooling device to an object being cooled by the cooling device. In one embodiment, the object being cooled may include a piece of electronic equipment, and preventing water carryover to the piece of electronic equipment may prevent damage to the piece of electronic equipment caused by exposure to water. In accordance with at least one embodiment of the invention, carryover of the water may be prevented by limiting one or more cooling parameters, such as a fan speed and/or a compressor speed, based on physical characteristics of an air flow between the cooling device and the electronic equipment. The physical characteristics may include, for example, a relative humidity of the air flow along with any other desired characteristics (e.g., temperature, pressure, air speed, absolute humidity, etc.).

Figure 1:
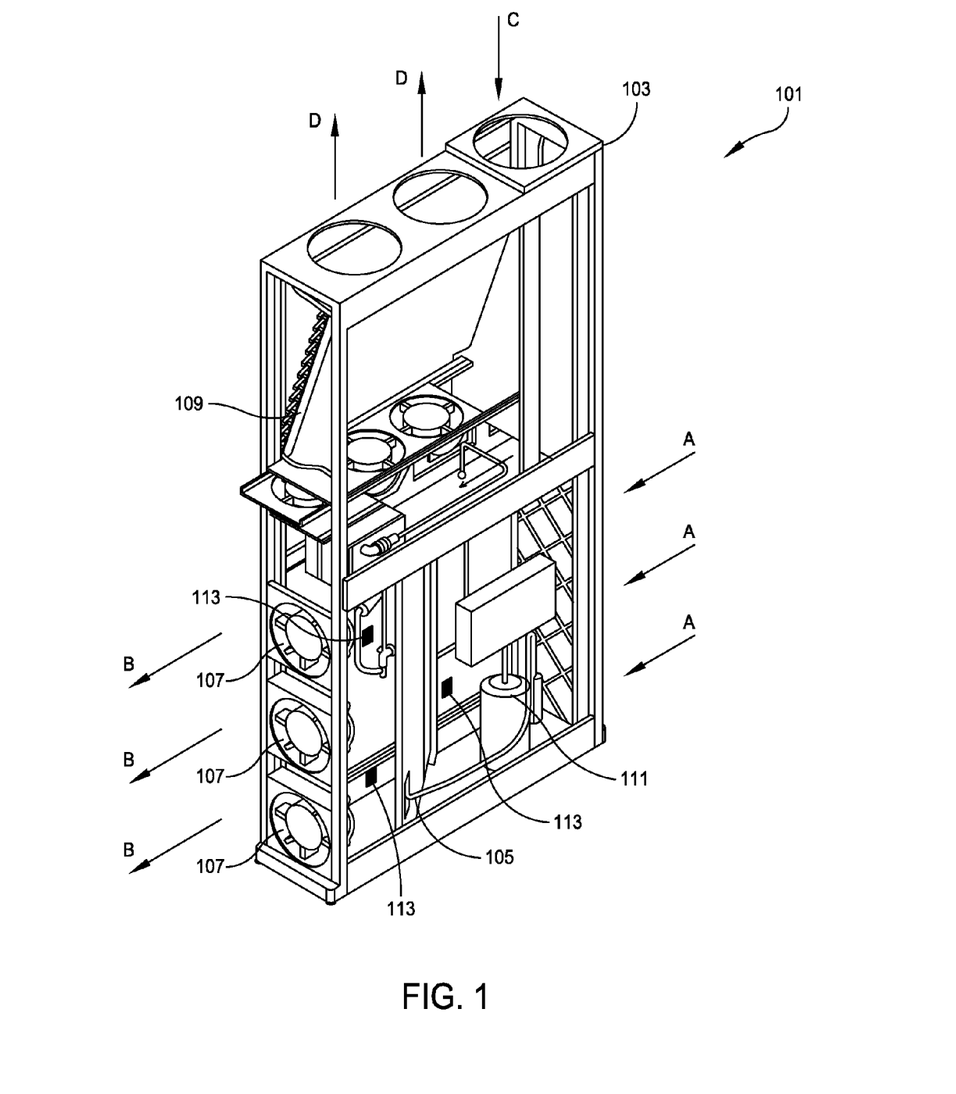
FIG. 1 is a perspective view of a cooling unit of an embodiment of the invention without an external housing.

At least one embodiment of the invention is directed at a CRAC unit. Examples of such CRAC cooling units are disclosed in detail in U.S. patent application Ser. No. 11/335,874 filed Jan. 19, 2006 and entitled "COOLING SYSTEM AND METHOD," Ser. No. 11/335,856 filed Jan. 19, 2006 and entitled "COOLING SYSTEM AND METHOD," Ser. No. 11/335,901 filed Jan. 19, 2006 and entitled "COOLING SYSTEM AND METHOD," Ser. No. 11/504,382 filed Aug. 15, 2006 entitled "METHOD AND APPARATUS FOR COOLING," and Ser. No. 11/504,370 filed Aug. 15, 2006 and entitled "METHOD AND APPARATUS FOR COOLING" which are hereby incorporated herein by reference. One embodiment of a CRAC unit 101 is illustrated in FIG. 1. As shown, the CRAC unit 101 includes a rack 103 configured to house the components of the CRAC unit 101 in the manner described below.

Some implementations of the invention may include InRow RP Chilled Water Systems available from APC, Corp., West Kingston, R.I., Network AIR IR 20 KW Chilled Water Systems available from APC, Corp., West Kingston, R.I., FM CRAC Series Systems available from APC, Corp., West Kingston, R.I., and/or any other heating or precision cooling equipment.

In one embodiment of the invention, the CRAC unit 101 may include an evaporator 105 configured to cool air. The evaporator 105 may include multiple evaporator coils that may increase a surface area of the evaporator 105. A coolant may flow through the evaporator 105 (e.g., through the evaporator coils) initially in a liquid form. As air is drawn over the evaporator 105 (e.g., over the evaporator coils) the air may be cooled by the coolant. The coolant, conversely, may be warmed by the air as the air is drawn over the evaporator 105 causing the coolant to evaporate.

In some embodiments of the invention, the air may be drawn across the evaporator 105 by one or more fans, each indicated at 107. The fans 107 may be arranged to draw warm air into the CRAC unit 101 from one direction (indicated by arrows A), move the air over the evaporator 105 so that the air is cooled, and then exhaust the cooled air from the CRAC unit 101 in a second direction (indicated by arrows B). As illustrated in FIG. 1, a plurality of fans 107 may be used to draw the air through the CRAC unit 101. Each fan 107 may be configured to adjust or otherwise vary the speed to increase or decrease the volume of air drawn through the CRAC unit 101 over the evaporator 105. As the fan speed increases, a larger volume of air may be drawn through the CRAC unit 101. Conversely, as the fan speed decreases, a smaller volume of air may be drawn through the CRAC unit 101. The fan speed may be controllable by a controller coupled to the CRAC unit 101, as described below.

It should be appreciated that in other implementations of a CRAC unit (e.g., 101), fans (e.g., 107) may be replaced or supplemented with one or more other air moving devices. Embodiments of the invention are not limited to CRAC units (e.g., 101) or other cooling devices that move air using fans (e.g., 107), but rather, any air moving device may be used. Air moving devices may be fully variable, semi-variable or non-variable. When the term "fan" is used herein it should be understood to mean any air moving device. When the term "fan speed" is used herein, it should be understood to include any regulator of a volume of air being moved by any air moving device. Furthermore, embodiments of the invention are not limited to cooling devices using any number of evaporators. Any cooling device using any heat exchanger may be used.

In one embodiment, the CRAC unit 101 may further include a condenser 109 configured to cool the coolant as cool air is drawn across the condenser 109. The condenser 109 may include multiple condenser coils that may increase a surface area of the condenser 109. The coolant may flow through the condenser 109 (e.g., through the condenser coils) in a gaseous form. As air is drawn over the condenser 109 (e.g., over condenser coils) the coolant may be cooled by the air causing the coolant to condense. Conversely, the air may be warmed by the coolant and exhausted from the CRAC unit 101. In one embodiment, air may be drawn into the CRAC unit 101 through a plenum along arrow C so as to move the air over the condenser 109 and out of the unit along an air path defined by arrows D. Fans may be provided to achieve the air flow over the condenser 109 as described above.

In one embodiment, the flow of the coolant through and between the evaporator 105 and the condenser 109 may be facilitated by a compressor 111. The compressor 111 may pump coolant through pipes coupling the compressor 111 to the evaporator 105 and the condenser 109 so that the coolant is warmed in the evaporator 105 as it cools air and is cooled in the condenser 109 as it warms air. The speed at which the compressor 111 pumps the coolant through the evaporator 105 may determine a cooling capacity of the CRAC unit 101 (i.e., amount of heat removed from the air by the CRAC unit 101 as the air moves over the evaporator 105). If more coolant is pumped to the evaporator 105, the evaporator 105 may remove a greater amount of heat from the air flowing over the evaporator 105. Moreover, if less coolant is pumped to the evaporator 105, the evaporator 105 may remove a smaller amount of heat from the air flowing across the evaporator 105. In one embodiment, the cooling capacity may also be manipulated by controlling the speed of the fans to vary the volume of air flowing over the evaporator 105 and the condenser 109.

In some implementations, a compressor (e.g., 111) may be fully variable between a minimum and maximum coolant flow rate. In other implementations, a compressor (e.g., 111) may be non-variable or semi-variable allowing one or a few discrete coolant flow rates. In still other implementations, a compressor (e.g., 111) may be configured as a matrix of multiple compressors acting collectively to control the flow rate. It should be appreciated that the invention is not limited to any specific compressor configuration listed above or otherwise. The flow rate of a compressor (e.g., 111) may be controlled by a controller coupled to the compressor, as described below.

In one embodiment, the CRAC unit 101 may include one or more sensors 113 to measure one or more physical characteristics of the air flow through the CRAC unit 101. The sensors 113 may include a relative humidity sensor, a temperature sensor, a pressure sensor, an absolute humidity sensor, an air speed sensor, or any other desired sensor. The purpose of the sensors 113 will become apparent as the description of the CRAC unit proceeds.

Figure 2A:
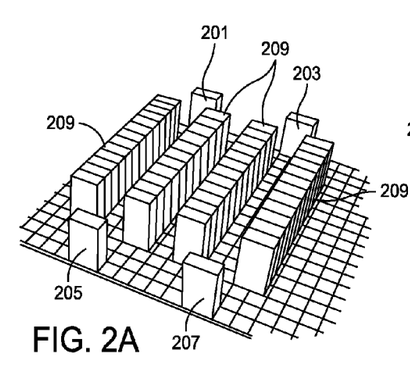
FIGS. 2A-D are four views showing data center configurations with each data center configuration being cooled in accordance with an embodiment of the invention.
Figure 2B:
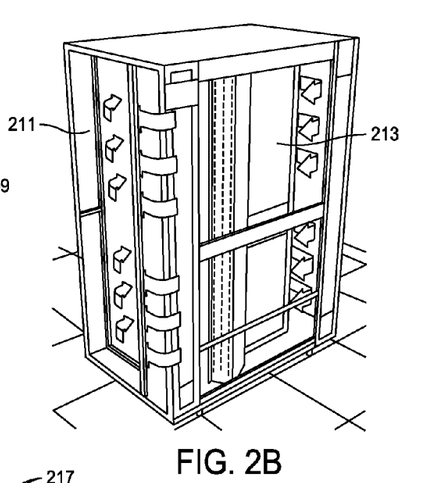
Figure 2C:
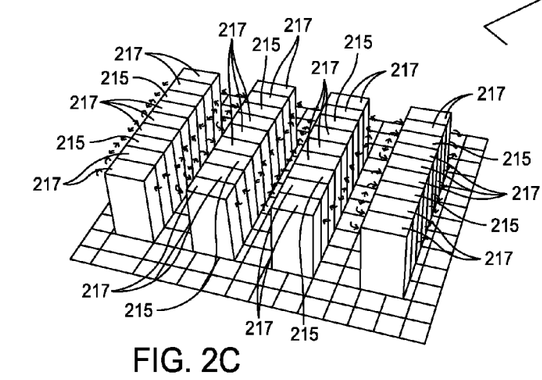
Figure 2D:
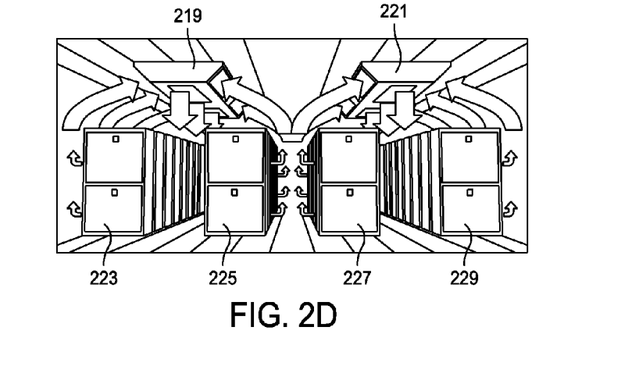

FIGS. 2A-2D illustrate some exemplary configurations of various CRAC units (e.g., 101) in accordance with various embodiments of the invention. As discussed, CRAC units (e.g., 101) are typically disposed in a data center room. FIG. 2A illustrates a room-based arrangement in which CRAC units 201, 203, 205, and 207 are disposed near the edge of a data center room and provide general cooling to the entire room, which is filled with rows of equipment racks, each indicated at 209. FIG. 2B illustrates a rack-based arrangement in which a CRAC unit 211 is coupled to an equipment rack 213 to provide dedicated cooling to that specific equipment rack 213. FIG. 2C illustrates a row-based arrangement in which CRAC units, each indicated at 215, may be arranged or otherwise interspersed in rows of equipment racks, each indicated at 217, to form hot aisles and cold aisles. The CRAC units 215 intake hot air exhausted by the equipment racks 217 from the hot aisles and output cold air to the cold aisles to cool the equipment racks 217. In such a configuration, equipment racks and CRAC units may be arranged in any ratio (e.g., two equipment units for every one CRAC unit, etc). FIG. 2D illustrates an alternative row based arrangement in which CRAC units 219 and 221 are disposed along the ceiling of a data center room. The CRAC units 219 and 221 and the rows of equipment racks 223, 225, 227, and 229 of FIG. 2D form hot and cold aisles.

It should be appreciated that the above illustrations of the CRAC unit 101 and illustrations of CRAC unit configurations (e.g., FIGS. 2A-D) are given as examples only. Embodiments of the invention are not limited to any particular configuration of CRAC units or any particular CRAC unit. Furthermore, embodiments of the invention are not limited to CRAC units, but may include any cooling device configured to cool any object.

Figure 3:
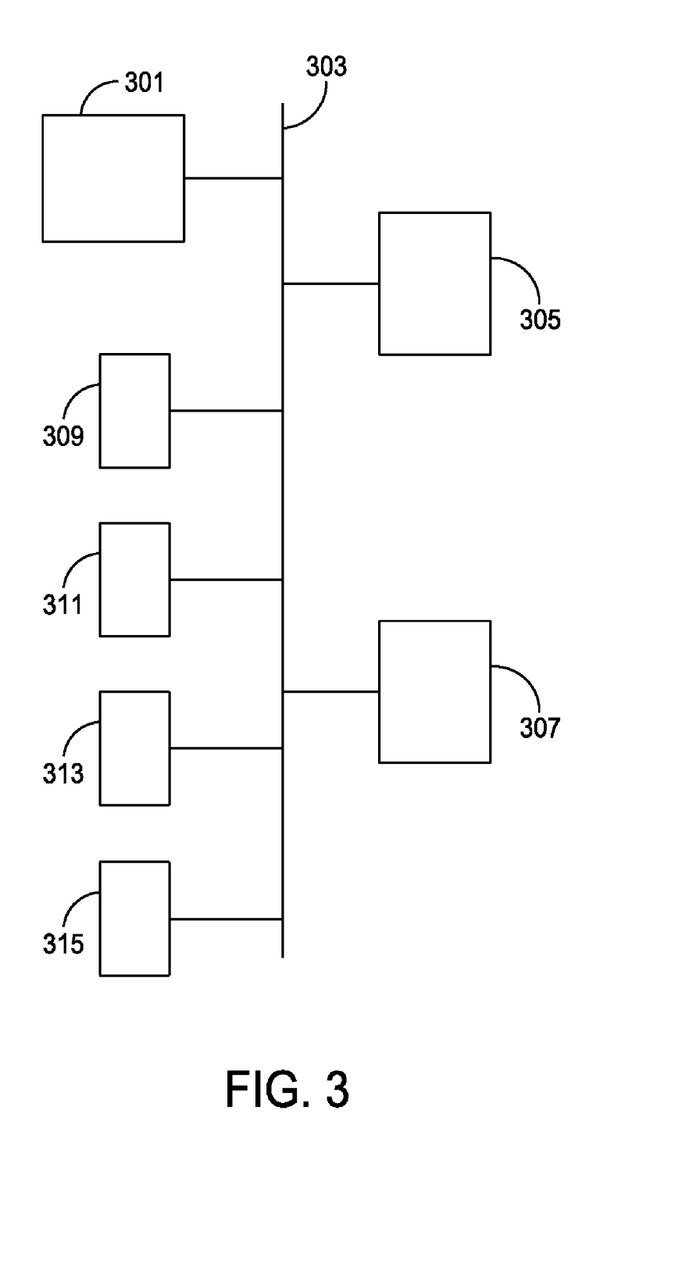
FIG. 3 is a schematic diagram of components of a cooling unit in accordance with an embodiment of the invention.

FIG. 3 illustrates a block diagram of some components of a cooling device (e.g., a CRAC unit 101) according to at least one embodiment of the invention. As described in more detail below, FIG. 3 illustrates a controller 301, one or more controlled devices 305, 307, and one or more sensors 309, 311, 313, 315 coupled by a communication network 303.

In one embodiment, the controller 301 may be dedicated to a single cooling device (e.g., CRAC unit 101). In another embodiment, the controller 301 may control a plurality of cooling devices (e.g., the controller 301 may be part of a main data center control system or a dedicated cooling system). In one embodiment, the controller 301 may include a Philips XAG49 micropressor, available commercially from the Phillips Electronics Corporation North America, New York, N.Y. The controller 301 may include a volatile memory and a static memory that may store information such as executable programs and other data useable by the controller 301. The controller may be coupled to an external memory device, such as a hard disk drive (not shown) that may also store executable programs and other data usable by the controller 301. In one embodiment, the controller 301 may communicate with other components of the cooling device (e.g., devices 305, 307, and sensors 309, 311, 313, 315) over a network 303. The network 303 may include an internal cooling device bus, a local area network, a wide area network, a wire, a fiber optic cable, and/or a wireless communication network. The controller 301, the devices 305, 307 and the sensors 309, 311, 313, 315 may communicate using analogue and/or digital communication.

As illustrated in FIG. 3, in one embodiment, the network 303 may couple the controller 301 to one or more devices (e.g., 305 and 307) that regulate the compressor speed and/or fan speeds of the cooling device. In one embodiment, the one or more devices include a compressor 305 and/or a fan 307. Controller 301 may communicate over the network 303 to adjust a parameter of the compressor 305 and/or the fan 307. For example, the controller 301 may transmit a control signal to the compressor 305 indicating a change in compressor speed. The compressor 305 may receive the control signal from the network 303 and adjust the speed of coolant flow accordingly. As another example, the controller 301 may transmit a control signal to the fan 307 indicating a change in fan speed. The fan 307 may receive the control signal from the network 303 and adjust its speed accordingly.

In one embodiment, the controller 301 may execute one or more control loops (e.g., proportional-integral-derivative (PID) loops) written in a firmware of the controller 301 to determine when and which control signals should be transmitted to controlled devices (e.g., 305 and 307). The control signals may be transmitted to adjust one or more cooling parameter so that a desired cooling output or other cooling condition may be maintained by the cooling device, if possible. Such a desired condition may, for example, be entered by a user of the cooling device (e.g., a data center administrator) through a control panel coupled to the controller 301.

In one instance, the controller 301 may be configured to maintain an output air mass that roughly matches an air mass taken in by the electronic equipment being cooled by the cooling device if possible. In that instance, the controller 301 may receive an input signal identifying the amount of air taken in by the electronic equipment from one or more sensors. The controller 301 may then generate one or more control signals to adjust a fan speed of the cooling device so that the amount of air output by the cooling device matches the amount of air taken in by the electronic equipment as closely as possible. In another instance, the controller 301 may be configured to maintain as close to a constant air output temperature as possible. To accomplish this desired function, compressor speed may be varied as the fan speed and temperature of intake air change. For example, if the temperature of air taken in by the cooling device as measured by a temperature sensor coupled to the controller 301 is increased, to maintain a constant output temperature, more heat may need to be removed from the air. To that end, the controller 301 may transmit a control signal to the compressor 305 to increase the compressor speed so as to deliver more coolant to the condenser.

To facilitate proper control of cooling parameters, some embodiments of the controller 301 and the network 303 may be coupled to one or more sensors 309, 311, 313, and 315. The sensors may measure physical characteristics relevant to determining which control signals to send to controlled devices (e.g., 305, 307). The sensors may include temperature sensors 309, relative humidity sensors 311, air speed and/or pressure sensors 313, and any other sensors 315 that may measure any physical characteristic relevant to the control of a cooling device. In one embodiment, each of the sensors may communicate the measured physical characteristics to the controller 301 through the network 303. The controller 301 may then generate appropriate control signals based on the received sensor information.

It should be appreciated that while the illustrated embodiment of a cooling device may include the controller 301, other embodiments may not include such a controller. For example, in some embodiments, sensors (e.g., 309, 311, 313, and 315) may be configured to provide input directly to a fan or compressor that may be configured to limit at least one parameter directly based on the sensor input.

In one aspect of the invention, it is recognized that water may be carried over by air flowing from an evaporator (e.g., 105) of a cooling device to electronic equipment being cooled by the cooling device. Pressure and/or speed of the air flow over the evaporator (e.g., 105) may lift water molecules and/or water drops present on the evaporator (e.g., from condensation on the evaporator coils) and carry them with the air flow to the electronic equipment. Air having high water content may have adverse effects on the reliability, performance, and useful life of the electronic equipment.

In one aspect of the invention, it is recognized that the likelihood of water carryover from the evaporator to the electronic equipment may be reduced or eliminated by appropriately controlling cooling parameters of the cooling device. A relative humidity of cooled air flowing from the cooling device may be indicative of how likely the air may carry water molecules to the cooled electronic equipment. As the relative humidity of the air increases, the air may be more likely to carry water (i.e. carry molecules and/or drops of water along with the air flow). Reducing a pressure and/or speed (e.g., by reducing a fan speed) of the air flow moving over the evaporator (e.g., 105) when the relative humidity of the air increases may reduce or eliminate the risk of water carryover. Alternatively or additionally, reducing the relative humidity by, for example, increasing the temperature of the air (e.g., by decreasing the compressor speed) may reduce the chance of water carry over.

In accordance with one aspect of the invention, at least one relative humidity sensor 311 may be disposed within an air flow of a cooling device. The relative humidity sensor 311 may measure the relative humidity of the air flow and transmit at least one representation of the relative humidity to the controller 301. In one implementation, the relative humidity sensor 311 may be positioned in the air flow between an evaporator (e.g., 105) of the cooling device and the electronic equipment being cooled by the cooling device. In another implementation, the relative humidity sensor 311 may be positioned in the air flow before the evaporator (e.g., 105) of the cooling device. In other implementations, multiple humidity sensors 311 may be disposed within the air flow at multiple locations. The humidity sensors 311 may be disposed within the cooling device, as illustrated by sensors 113 in FIG. 1, outside of the cooling device, or some combination thereof.

Figure 5:
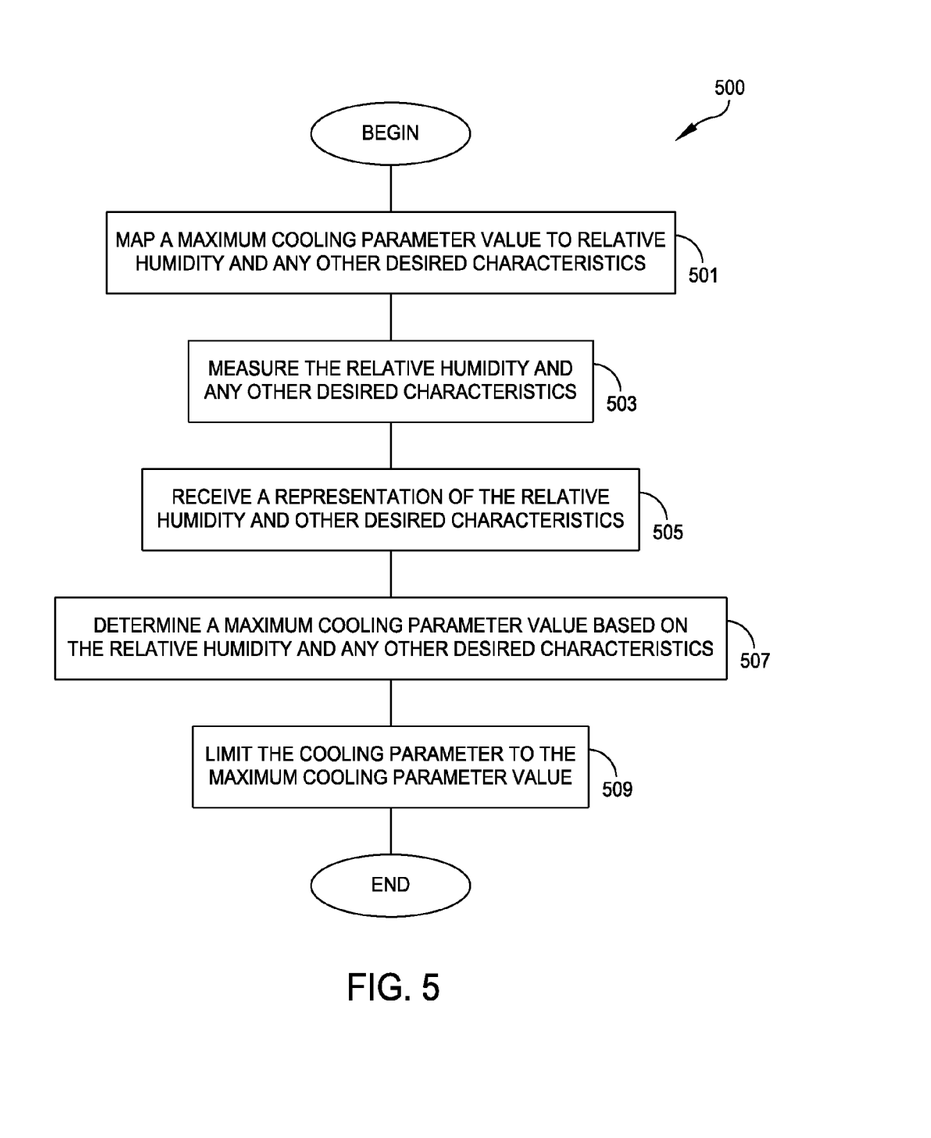
FIG. 5 is a flow chart showing the control of a cooling device in accordance with an embodiment of the invention.

In accordance with some embodiments of the invention, as indicated in block 501 of the process 500 illustrated in FIG. 5, a mapping of relative humidity to at least one cooling parameter may be generated and stored in a memory of the controller 301 or an external memory coupled to the controller 301. In one embodiment, the mapping may be made before the cooling device is installed in the environment it is designed to cool. For example, the mapping may be made at the time the cooling device is designed by a cooling device manufacturer.

Figure 4:
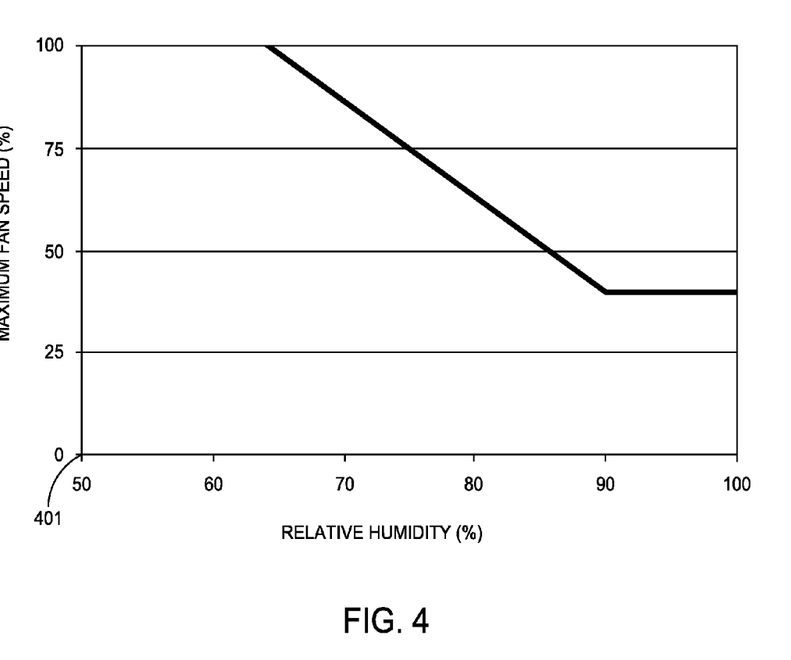
FIG. 4 is a mapping of cooling parameters to relative humidity in accordance with an embodiment of the invention.

An example mapping of maximum cooling parameters to relative humidity is illustrated in FIG. 4. Graph 401 illustrates a mapping of maximum fan speeds that are unlikely to result in water carryover to relative humidity values. Such a mapping may be generated by varying a mapped characteristic (e.g., fan speed) and measuring one or more mapping variables (e.g., relative humidity). In one embodiment a mapping may include a mapping function derived from such a mapping process (e.g., a polynomial or other function derived from mapped points on a graph such as by well-known numerical methods). In one embodiment, a mapping may include one or more database tables of values. Such mapping tables may not include every possible relative humidity value. Maximum cooling parameter values that correspond to relative humidity values not included in the mapping, however, may still be determined by reference to the relative humidity values that are included in the mapping. In one implementation, the relative humidity value not in the mapping may be treated as the next highest relative humidity value that is in the mapping. In other implementations, a numerical method may be used to approximate the maximum cooling parameter. For example, an average of the values of the maximum cooling parameters that correspond to relative humidity values within the mapping that are near the measured humidity value may be used as the maximum cooling parameter value.

In one embodiment, rather than maximum fan speed, maximum air mass flow may be mapped to relative humidity and another mapping may be used to determine a maximum fan speed based on the maximum air mass flow. In some implementations, a mapping of air mass flow and/or fan speed may include one or more corrective measurements. For example, in some instances, as a filter becomes clogged or an air coil builds condensation, pressure or speed loss of air traveling through/by may increase thereby requiring a greater fan speed to generate a desired level of air mass flow. In some implementations, a pressure or speed loss through or by components of the CRAC unit 101 (e.g., filters, air cools) may be measured and included in a mapping of fan speed and/or air mass flow to maximum cooling parameter value. As another example, in some instances, air contamination, temperature of air, and/or absolute humidity of air moving through the CRAC unit 101 may affect an air mass flow level at a given fan speed. In some implementations, air contamination, temperature, and/or absolute humidity may be mapped to an air mass flow and/or fan speed. In some implementations, air mass flow may be monitored and fan speed may be adjusted to maintain a desired air mass flow. In some implementations, air mass flow may be determined by on one or more hot wire and/or hot plate measurements.

Physical characteristics other than relative humidity may also affect the possibility of water carryover to the electronic equipment. For example, temperature, absolute humidity, dew point, speed, and pressure of the air flow may affect the possibility of water carryover. In some implementations, these characteristics may be measured and mapped in addition to or as an alternative to relative humidity. Sensors (e.g., 309, 311, 313, 315) may be disposed within the air flow to measure these other physical characteristics similar to the disposition of the humidity sensors 311 as described above.

In some embodiments, a mapping may include more than the two dimensions illustrated in table 401. For example, if multiple relative humidity sensors are used, the mapping may include a dimension for each relative humidity reading. A mapping may also include additional dimensions for each other characteristic such as temperature, air speed, pressure, and/or absolute humidity.

In one embodiment, the mapping may be generated by varying the desired physical characteristics over a range expected during operation of the cooling device. While the parameters are varied, the air flow out of the cooling device may be measured for water carryover. The cooling parameters to be included in the mapping may be varied at each value of the desired physical characteristics. The maximum cooling parameter values for which water is not carried over (e.g., is carried over less than a desired threshold amount) may be recorded over the range of the desired physical characteristics.

In some instances, when multiple cooling parameters are being mapped, there may be more than one way to limit the cooling parameters to prevent water carryover. For example, a fan speed may be limited or a compressor speed may be limited, or both may be limited. In some implementations, a value may be chosen for a mapping according to one or more cooling goals. For example, in one implementation, the cooling parameter values of a mapping may be chosen so that the resulting cooling output is greater than if another set of cooling values that also prevent water carryover were chosen (e.g., if two sets of values would prevent water carryover, one in which a fan speed is limited and another in which a compressor speed is limited, the one which provides the higher total cooling output may be chosen). In another implementation, the values mapped as the limiting cooling parameters may be chosen according to some preferred order (e.g., if fan speed is above a minimum level, fan speed may be limited before compressor speed is limited).

In other embodiments, one or more equations may be used in place of or in addition to the mapping. For example, an equation that describes the relationship between relative humidity and maximum fan speed may be used in place of a mapping of relative humidity to maximum fan speed. The controller may then determine the maximum cooling parameter (e.g., fan speed and compressor speed) by computing the solution to the appropriate equation using measured characteristics from the sensors. It should be recognized that any set of stored values (e.g. mapped values, equations, etc.) from which a parameter value may be derived may be used in some embodiments of the present invention.

In operation, and with reference to FIG. 5, a cooling device according to one embodiment of the invention may measure at least one relative humidity and/or other desired characteristics of the air flow, if any, using a relative humidity sensor (e.g., 311) and any other desired sensors (e.g., 309, 313, 315), if any, as indicated in block 503. The sensors (e.g., 309, 311, 313, 315) may then transmit a representation of the relative humidity and any other measured characteristics to the controller (e.g., 301) through a network (e.g., 303). The controller (e.g., 301), as indicated in block 505 of FIG. 5, may then receive the representations of the relative humidity and any other measured characteristics.

In some embodiments, after receiving the representations from the sensors, the controller (e.g., 301) may reference the mapping of cooling parameters to measured characteristics. As indicated in block 507 of FIG. 5, the controller (e.g., 301) may determine a maximum value of a cooling parameter from the mapping by referencing the maximum value corresponding to the received representations.

In one embodiment, as described above, the mapping may map the measured characteristics to a maximum fan speed that corresponds to a maximum pressure and/or speed of air through the cooling device to prevent water carryover to the electronic equipment. In one implementation, the fan speed may be the only adjustable cooling component, for example, in cooling devices with non-variable compressors or where maintaining a constant cooling capacity of the compressor is more important than the volume of air delivered to the electronic equipment.

In another embodiment, as described above, the mapping function may map the measured characteristics to a maximum compressor speed that corresponds to a temperature that may result in a safe relative humidity. As temperature decreases, relative humidity increases, thereby limiting the temperature drop of air moving through the cooling device by limiting the speed of the compressor, which may result in a higher relative humidity. This higher relative humidity may, in turn, allow a higher pressure and/or speed of air flow through the cooling device without water carryover to the electronic equipment. In one implementation, the compressor speed may be the only adjustable cooling parameter, for example, in cooling devices with non-variable fans or where maintaining a constant fan speed is more important than maintaining a specific temperature of air.

In one embodiment, as discussed above, the mapping function may map the measured characteristic to a combination of a maximum compressor speed and a maximum fan speed. The combination of maximum compressor speed and maximum fan speed may be configured to stay within particular cooling guidelines as well as prevent water carryover to the electronic equipment. For example, if an absolute minimum fan speed is required to cool the electronic equipment, the maximum fan speed parameter may be limited during the mapping so that it does not drop below the absolute minimum speed. To prevent water carryover at the absolute minimum speed of the fan, the compressor speed may be lowered.

In one embodiment, as indicated in block 509 of FIG. 5, after determining the maximum cooling parameter value, the controller (e.g., 301) may limit the cooling parameter to the determined maximum value by transmitting an appropriate control signal to the controlled device. The maximum value may be lower than the value at which the controller would otherwise operate the controlled devices (e.g., 305, 307) to provide the desired cooling conditions, as described above. In which case, the controller may operate the cooling device at the maximum level to prevent water carryover instead of at the level that would otherwise maintain the desired cooling conditions. However, the maximum value may be greater than or equal to the level at which the controller (e.g., 301) would otherwise operate the controlled devices (e.g., 305, 307). In which case, the controller may ignore the maximum value and operate the cooling device as normal (e.g., at the level needed to maintain the desired cooling conditions).

By employing such a method, the controller may eliminate or reduce the possibility of a water carryover from the cooling device to the electronic equipment without requiring additional filters or artificially limiting the cooling parameters. It should be appreciated, however, that the invention is not limited to any particular set of steps of measured characteristics.

Although embodiments of the invention have been described with respect to electronic equipment in data center environments, it should be recognized that embodiments of the invention are not so limited. Rather, embodiments of the inventions may be used to prevent water carryover to any object in any environment and/or space. For example, embodiments of the invention may be used with telecommunication equipment in outdoor environments or shelters, telecommunication data centers, and/or mobile phone radio base-stations. Embodiments of the invention may be used to with precious goods such as art work, books, historic artifacts and documents, and/or excavated biological matters (for example, for preservation purposes). Embodiments of the invention may be used for preservation of meats, wines, spirits, foods, medicines, biological specimens and samples, and/or other organic substances. Further embodiments may be used for process optimization in biology, chemistry, greenhouse, and/or other agricultural environments. Still other embodiments may be used to protect against corrosion and/or oxidization of structures (for example, buildings, bridges, or large structures).

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of preventing water carryover to an object cooled by an air flow from a cooling device, the method comprising acts of:
   A) receiving at least one representation of a relative humidity of the air flow;
   B) preventing water carryover to the object by adjusting at least one cooling parameter of the cooling device based, at least in part, on the relative humidity, wherein preventing water carryover includes adjusting at least one cooling parameter based, at least in part, on the relative humidity and the at least one of the absolute humidity, the temperature, the speed, and the pressure of the air flow through the cooling device;
   C) receiving a representation of at least one of an absolute humidity, a temperature, a speed, and a pressure of the air flow through the cooling device; and
   D) mapping a plurality of maximum values of the at least one cooling parameter based, at least in part, on a plurality of values of the relative humidity and the at least one of the absolute humidity, the temperature, the speed, and the pressure of the air flow through the cooling device.

2. The method of claim 1, wherein the act B includes an act of limiting the at least one cooling parameter to a mapped maximum value corresponding to a value of the relative humidity and the at least one of the absolute humidity, the temperature, the speed, and the pressure of the air flow through the cooling device.

3. The method of claim 1, further comprising an act of E) measuring the at least one of the absolute humidity, the temperature, the speed, and the pressure of air flow through the cooling device.

4. The method of claim 3, wherein the act E) includes using at least one sensor positioned in the air flow between the cooling device and the electronic equipment to measure the at least one of the temperature, the absolute humidity, the speed, and the pressure of the air flow through the cooling device.

5. A method of preventing water carryover to an object cooled by an air flow from a cooling device, the method comprising acts of:
   A) receiving at least one representation of a relative humidity of the air flow;
   B) preventing water carryover to the object by adjusting at least one cooling parameter of the cooling device based, at least in part, on the relative humidity; and C) mapping a plurality of maximum values of the at least one cooling parameter based, at least in part, on a plurality of values of the relative humidity.

6. The method of claim 5, wherein the relative humidity includes the relative humidity of the air flow provided to the object from the cooling device.

7. The method of claim 5, wherein the at least one cooling parameter includes at least one of a compressor speed and a fan speed.

8. The method of claim 5, wherein the maximum value includes at least one of a maximum compressor speed of the cooling device and a maximum fan speed of the cooling device.

9. The method of claim 5, further comprising an act of D) measuring the relative humidity.

10. The method of claim 9, wherein the act D includes using at least one relative humidity sensor positioned in an air flow between the cooling device and the object to measure the relative humidity of the air flow.

11. The method of claim 5, wherein the act B includes an act of limiting the at least one cooling parameter to a mapped maximum value corresponding to a value of the relative humidity.

12. The method of claim 5, wherein the object includes at least one piece of electronic equipment.

* * * * *